United States Patent
Chen (10) Patent No.: US 8,938,134 B2
(45) Date of Patent: Jan. 20, 2015

(54) HYBRID OPTICAL MODULATOR FOR PHOTONIC INTEGRATED CIRCUIT DEVICES

(71) Applicant: Alcatel-Lucent, USA Inc., Murray Hill, NJ (US)

(72) Inventor: Long Chen, Marlboro, NJ (US)

(73) Assignee: Alcatel Lucent, Boulogne-Billancourt (FR)

(*) Notice: Subject to any disclaimer, the term of this patent is extended or adjusted under 35 U.S.C. 154(b) by 0 days.

(21) Appl. No.: 13/724,926

(22) Filed: Dec. 21, 2012

(65) Prior Publication Data

US 2014/0177994 A1 Jun. 26, 2014

(51) Int. Cl.
| | | |
|---|---|---|
| G02F 1/035 | (2006.01) | |
| H01L 21/00 | (2006.01) | |
| G02F 1/025 | (2006.01) | |
| H01L 33/58 | (2010.01) | |
| H01L 31/103 | (2006.01) | |
| H01L 31/105 | (2006.01) | |
| G02B 6/12 | (2006.01) | |

(52) U.S. Cl.
CPC ............. *G02F 1/025* (2013.01); *H01L 33/58* (2013.01); *H01L 31/1035* (2013.01); *H01L 31/105* (2013.01); *G02B 6/12002* (2013.01); *G02B 6/12004* (2013.01)
USPC .................................. 385/2; 438/31; 438/69

(58) Field of Classification Search
USPC .......................................... 385/2; 438/31, 69
See application file for complete search history.

(56) References Cited

U.S. PATENT DOCUMENTS

2012/0002694 A1 1/2012 Bowers et al.
2012/0294566 A1* 11/2012 Ho et al. ..................... 385/14

OTHER PUBLICATIONS

Jain, Siddharth R., et al. "Integrated Hybrid Silicon Transmitters." Journal of Lightwave Technology 30.5 (2012): 671-678.
Duan, G-H., et al., "Integrated Hybrid III-V/Si Laser and Transmitter," 2012 International Conference on Indium Phosphide and Related Materials (IPRM), Aug. 27, 2012, pp. 16-19.
Roelkens, G., et al., "III-V/Si Phontonics by Die-to-Wafer Bonding," Materials Today, Elsevier Science, vol. 10, No. 7-8, Jul. 1, 2007, pp. 36-43.
Srinivasan, S., et al., "Gain Assisted Hybrid Silicon Microring Electro-Absorption Mosulators," 2012 IEEE 9th International Conference onGroup IV Photonics (GFP), Aug. 29, 2012, pp. 99-101.
Tang, Y. et al., "50 Gb/s Hybrid Silicon Traveling-Wave Electroabsorption Modulator," 2011 Optical Society of America, Optics Express, vol. 19, No. 7, Mar. 28, 2011, pp. 5811-5816.
Foreign Communication From a Related Counterpart Application, PCT Application No. PCT/US2013/075916, International Search Report and Written Opnion dated Mar. 18, 2014, 12 pages.

* cited by examiner

*Primary Examiner* — Jerry Blevins
(74) *Attorney, Agent, or Firm* — Hitt Gaines, PC (57) ABSTRACT

An apparatus comprising an optical modulator, wherein the optical modulator comprises a planar substrate, a first III-V semiconductor layer on the substrate, and a silicon layer on the substrate. The optical modulator includes a planar semiconductor optical waveguide having a hybrid optical core, the hybrid optical core including vertically adjacent lateral portions of the first III-V semiconductor layer and the silicon layer.

14 Claims, 11 Drawing Sheets

FIG. 9 (con't)

HYBRID OPTICAL MODULATOR FOR PHOTONIC INTEGRATED CIRCUIT DEVICES

TECHNICAL FIELD

The present inventions relate to optical devices including an optical modulator and to methods for manufacturing and/or using the same.

BACKGROUND

This section introduces aspects that may help facilitate a better understanding of the disclosure. Accordingly, these statements are to be read in this light and are not to be understood as admissions about what is prior art or what is not prior art.

There is a growing need for the efficient integration of electronic (e.g. CMOS), active optical (e.g. powered), and passive optical (e.g., non-powered) components of hybrid photonic integrated circuits. Such integration can lead to performance improvements of optical devices having such circuits, e.g., by reducing many parasitic effects associated with packaging of conventional system solutions, as well as reducing the device's foot-print, power consumption, and manufacturing cost.

SUMMARY

One embodiment is an apparatus. The apparatus comprises an optical modulator, wherein the optical modulator comprises a planar substrate, a first III-V semiconductor layer on the substrate, and a silicon layer on the substrate. The optical modulator includes a planar semiconductor optical waveguide having a hybrid optical core, the hybrid optical core including vertically adjacent lateral portions of the first III-V semiconductor layer and the silicon layer.

In some such embodiments, a lower portion of the first III-V semiconductor layer is in physical contact with an upper portion of the silicon layer.

Any such embodiments can further comprise a first metallic electrical contact in physical contact with the first III-V semiconductor layer and a second metallic electrical contact in physical contact with the silicon layer. In some such embodiments the first and second metallic contacts are able to apply a voltage across the hybrid optical core such that an optical refractive index of the hybrid optical core is changed. In other such embodiments, the first and second metallic electrical contacts are able to apply a voltage across the hybrid optical core such that an optical attenuation of the hybrid optical core is changed.

Any such embodiments can further include a second III-V semiconductor layer adjacent to the first III-V semiconductor layer, wherein the hybrid optical core includes vertically adjacent lateral portions of the first and second III-V semiconductor layers, and the silicon layer. In some such embodiments, a first metallic electrical contact is in physical contact with the second III-V semiconductor layer and a second metallic electrical contact in physical contact with the silicon layer.

In any such embodiments, the first and second III-V semiconductor layers can be part of a stack of III-V semiconductor layers, each layer of the stack having a different III-V semiconductor alloy composition.

In any such embodiments, can further include an insulating layer located adjacent to the first III-V semiconductor layer and the silicon layer.

Another embodiment is a method. The method comprises forming an optical modulator, including: forming a planar substrate, forming a first III-V semiconductor layer on the substrate, and forming a silicon layer on the substrate. The optical modulator includes a planar semiconductor optical waveguide having a hybrid optical core, the hybrid optical core including vertically adjacent lateral portions of the first III-V semiconductor layer and the silicon layer.

In some such embodiments, a lower portion of the first III-V semiconductor layer can be in physical contact with an upper portion of the silicon layer.

Any such embodiments can further comprise forming a first metallic electrical contact in physical contact with the first III-V semiconductor layer and forming a second metallic electrical contact in physical contact with the silicon layer. In some such embodiments the first and second metallic contacts are able to apply a voltage across the hybrid optical core such that an optical refractive index of the hybrid optical core is changed. In other such embodiments the first and second metallic electrical contacts are able to apply a voltage across the hybrid optical core such that an optical attenuation of the hybrid optical core is changed.

Any such embodiments can further include forming a second III-V semiconductor layer adjacent to the first III-V semiconductor layer, wherein the hybrid optical core includes vertically adjacent lateral portions of the first and second III-V semiconductor layers, and the silicon layer. Some such embodiments can include forming a first metallic electrical contact in physical contact with the second III-V semiconductor layer, and forming a second metallic electrical contact in physical contact with the silicon layer. In any such embodiments the first semiconductor layers and the second III-V semiconductor layers can be part of a stack of III-V semiconductor layers, each layer of the stack having a different III-V semiconductor alloy composition.

Any such embodiments can further include forming an insulating layer located adjacent to the first III-V semiconductor layer and the silicon layer.

BRIEF DESCRIPTION OF THE DRAWINGS

The embodiments of the disclosure are best understood from the following detailed description, when read with the accompanying FIGUREs. Various features may not be drawn to scale and may be increased or reduced in size for clarity of discussion. Reference is now made to the following descriptions taken in conjunction with the accompanying drawings, in which.

DETAILED DESCRIPTION

The description and drawings merely illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments, as well as specific examples thereof, are intended to encompass equivalents thereof. Additionally, the term, "or," as used herein, refers to a non-exclusive or, unless otherwise indicated. Also, the various embodiments described herein are not necessarily mutually exclusive, as some embodiments can be combined with one or more other embodiments to form new embodiments.

The present disclosure provides an integrated optical device having an optical modulator that includes a combination of a silicon waveguide and a stack of III-V compound semiconductor layers (e.g., compound semiconductors layers based on alloys of group III and group V elements of the periodic table, such as GaAs, InP, $GaAs_xP_{1-x}$, $In_xGa_{1-x}As_yP_{1-y}$, and the like). Some of the hybrid optical modulators disclosed herein can integrate other optical components. For example, some portions of the silicon waveguide can be a part of passive optical waveguide component(s), and, some portions of the stack of III-V compound semiconductor layers can be part of active optical device(s). Such hybrid integrated devices can provide reduced material and/or fabrication costs.

Figure 1:
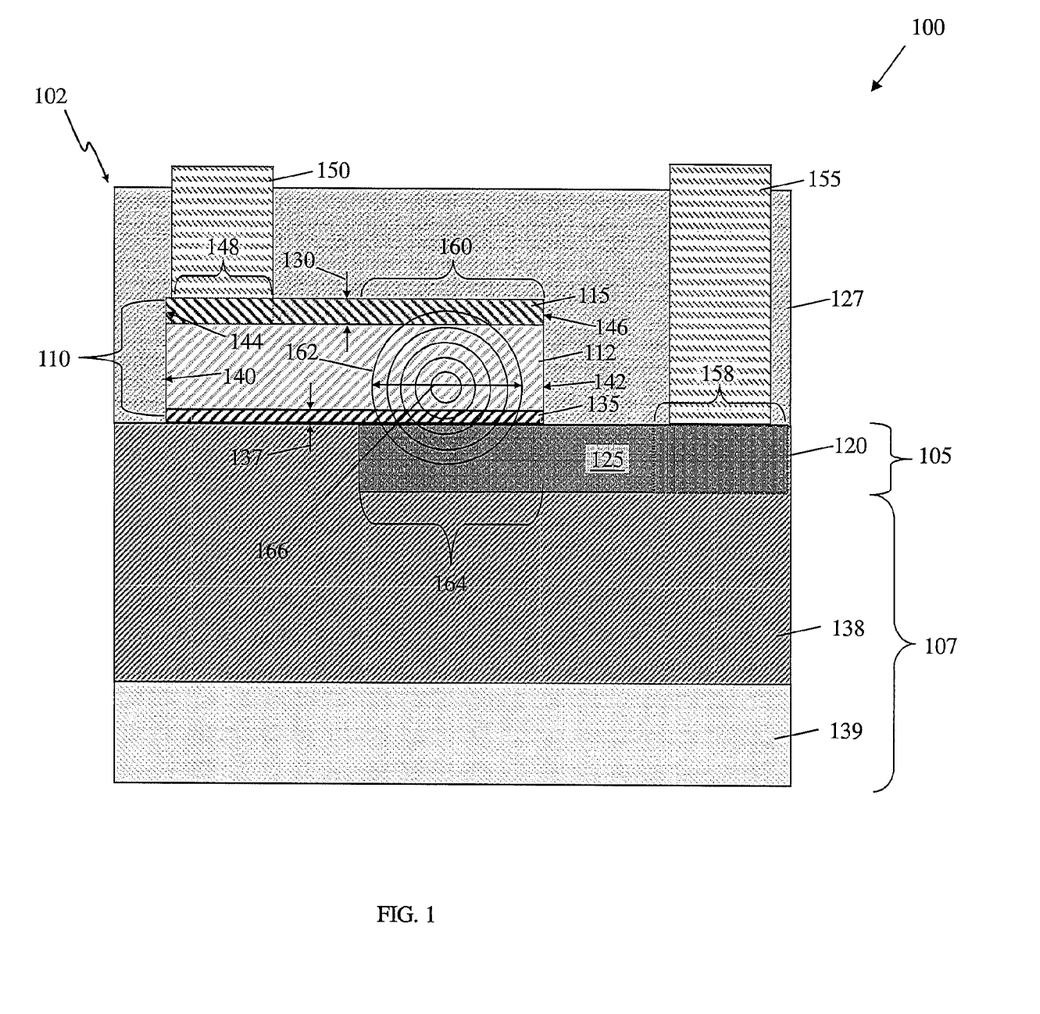
FIG. 1 presents a schematic cross-section view of an embodiment of an optical device that comprises an optical modulator.

One embodiment includes an optical modulator. FIG. 1 presents a schematic cross-section view of an embodiment of an optical device or apparatus 100 that comprises an optical modulator 102 (also referred to herein equivalently as an optical modulator device or device).

The example optical modulator 102 comprises a silicon optical waveguide layer 105 located on a substrate 107 and a stack 110 of III-V compound semiconductor material layers ("III-V semiconductor layer"). The stack 110 includes a first III-V semiconductor layer 112 and a second III-V semiconductor layer 115 located adjacent to the first III-V semiconductor layer 112. As understood by one of ordinary skill the first III-V semiconductor layer 112 has at least one electro-optical material layer. The term electro-optical material layer as used herein is defined as a III-V compound semiconductor material layer whose optical properties (e.g., one or both of absorption constant or refractive index) changes in response to a changing electric field. In some cases, the first III-V semiconductor layer 112 can be or have a quantum well layer, or in some cases, have one or more quantum well layers interleaved with barrier layers made of III-V compound semiconductor materials. For instance, in some embodiments, the first III-V semiconductor layer 112 can include a single bulk layer of $In_xGa_{1-x}As_yP_{1-y}$ with a desired stoichiometry. For instance, in some embodiments, the first III-V semiconductor layer 112 can include one or more III-V compound semiconductor material quantum well layers and barrier layers that are both composed of $In_xGa_{1-x}As_yP_{1-y}$, with alternating layers having an alternating stoichiometry. For instance, the barrier layers can have a larger band gap than the quantum well layers, such as disclosed in U.S. patent application Ser. No. 13/041,976, filed on Mar. 7, 2011 and which is incorporated by reference herein in its entirety.

The second III-V semiconductor layer 115 of the stack 110 can be composed of another III-V compound semiconductor material, such as InP. The second III-V semiconductor layer 115 can doped with one of a p-type dopant or an n-type dopant. As illustrated in FIG. 1, the first III-V semiconductor layer 112 is located in-between the second III-V semiconductor layer 115 and a silicon layer 120 that can include a doped portion 125 of the silicon optical waveguide layer 105. In some cases, the first III-V semiconductor layer 112 can be in direct physical contact with the silicon layer 120, or doped portion 125, when present. The doped portion 125 is doped to increase its electrical conductivity to a sufficient level to facilitate the silicon layer 120 serving as part of a semiconductor junction. The doped portion 125 of the silicon waveguide layer 105 thereby serves as part of the electrical connection of the optical modulator device 102, thereby making the optical modulator device a hybrid of III-V compound semiconductor materials and silicon.

The doped portion 125 can be doped with an opposite one of the p-type dopant or the n-type dopant that the second III-V semiconductor layer 115 is doped with, depending upon the desired configuration of the optical modulator device 102. As one skilled in the art would understand, silicon and III-V semiconductors may not be doped by the same species of impurity or dopant atom but may be doped with different species of impurity or dopant atom of the same or opposite dopant type. The doped silicon portion 125 along with the second III-V semiconductor layer 115 can form one of p-n or p-i-n junctions of the optical modulator device 102. For instance, in some embodiments of the device 102, the second III-V semiconductor layer 115 and the doped portion 125 of the silicon optical waveguide layer 105 are doped with the opposite ones of the p-type dopant and the n-type dopant. That is, when the second III-V semiconductor layer 115 is doped with an n-type dopant, then the doped portion 125 is doped with a p-type dopant. Or, when the second III-V semiconductor layer 115 is doped with a p-type dopant, then the doped portion 125 is doped with an n-type dopant. In such cases, the second III-V semiconductor layer 115 and the doped portion 125 are part of a p-n junction or a p-i-n junction of the optical modulator device 102.

As further illustrated in FIG. 1, the waveguide layer 105 and the stack 110 can be covered by an insulating layer 127 (e.g., silicon oxide) that can serve as an optical cladding layer. As the refractive indices of the silicon layer 120 and the III-V stack 110 are comparable and much higher than the surrounding cladding layer 127, 138 the effective waveguide core includes overlapping regions (e.g., vertically overlapping regions in FIG. 1) of the silicon layer 120 and the III-V stack 110, e.g., the part 160 of the second III-V layer 115 layer that is adjacent (e.g., vertically adjacent in FIG. 1) to a light containing portion of the first III-V semiconductor layer 112, and, the part 164 of the silicon layer 120 that is adjacent (e.g., vertically adjacent in FIG. 1) to the light-containing portion of the first III-V semiconductor layer 112. The portions of layers 110, 112, 115 bounded within part 160 and part 164 can form a hybrid optical core. For instance, FIG. 1 illustrates an example confinement of optical mode (e.g., single mode) profile contour lines 162 in an embodiment of these overlapping regions of a hybrid optical core of the device 100. Furthermore, the portions of layers 110, 112, 115 bounded within part 160 and part 164 form a semiconductor junction (e.g., p-n, n-p, p-i-n, n-i-p junctions) of the device 102.

Embodiments of the disclosed optical modulator device 102 can have physical and/or performance advantages as compared to previous optical modulator devices formed solely of III-V compound semiconductor materials, and the level of optical confinement is typically considerably lower. The stronger optical confinement of the disclosed device 102 facilitates having a higher optical signal modulation efficiency, e.g., for a given voltage difference applied across the second III-V semiconductor layer 115 and silicon layer 120.

Also, stronger optical confinement allows smaller device dimensions and there can be reduced diode and parasitic capacitance. This, in turn, can lead to improved bandwidths or speeds for embodiments of the disclosed optical modulator device 102 compared to previous optical modulator devices formed solely of III-V compound semiconductor materials. In some embodiments, for example, the lateral widths of optical confinement 166, e.g., within the parts 160 and 164 (FIG. 1) can be about 0.5 microns or smaller, while in previous optical modulator devices the lateral optical confinement width is at least one micron or larger.

Additionally, because of the strong optical confinement, metal control electrodes (e.g., metallic electrical contacts 150 and 155) can be placed relatively closer to the center of the device 102 where the optical mode 162 resides. Also, since part of the electrical connections is implemented in the doped portion 125, there is no need to use a relatively thicker p-doped III-V compound semiconductor material layer as the second III-V semiconductor layer 115. This is advantageous since p-doped III-V compound semiconductor material layers serving as part of the hybrid optical core, such as p-doped InP, can require high-level doping to achieve sufficiently high conductivity, e.g., due to the low mobility of holes. However, at the same time high-levels p-doping in such layers can introduce strong levels of optical absorption. Therefore, for instance, in some embodiments of the modulator device 102, it is preferred for the second III-V semiconductor layer 115 that is made of a doped III-V compound semiconductor material layer to be n-doped. An n-doped III-V compound semiconductor material layer (e.g., n-doped InP) can be relatively thinner, provide a higher electrical conductivity, and have lower optical absorption, as compared to a similar p-doped III-V compound semiconductor material layer. The thinner layer 115 further allow better optical confinement in the first III-V semiconductor layer 112 and can allow simplified integration of the modulator device 102 with other optical components of the device 100, such as hybrid lasers, semiconductor optical amplifiers (SOAs), or optical detectors.

For instance, in some embodiments of the modulator device 102, the second III-V semiconductor layer 115 includes or is a III-V compound semiconductor material layer having the n-dopant type (e.g., phosphorus, arsenic, antimony or other electron donors) in a concentration of at least about $1E18$ $cm^{-3}$ and more preferably $1E18$ to $5E18$ $cm^{-3}$ and even more preferably $1E19$ $cm^{-3}$. In some embodiments, the n-doped III-V compound semiconductor material layer has a thickness 130 of about 1 micron or less, and more preferably about 0.2 microns or less and more preferably about 0.1 microns or less.

In some embodiments of the modulator device 102, to facilitate integration with other optical components of the optical device 100, an n-doped III-V semiconductor material layer of the second III-V semiconductor layer 115 is located above the silicon optical waveguide layer 105 on the substrate 107.

In other embodiments of the modulator device 102, however, the second III-V semiconductor layer 115 includes an III-V compound semiconductor material layers doped with the p-type dopant, and, the silicon layer 120 includes the doped silicon portion 125 doped with the n-type dopant or with p-type dopant. Such embodiments still use the portion 125 of silicon to form the p-i-n junction, and thereby dispense with the need to have an n-doped III-V layer as part of the device 102. However, such configurations can be less advantageous, than comparable configurations using an n-doped second III-V semiconductor layer 115, in terms of confinement, absorption loss, and bandwidth.

As further illustrated in FIG. 1, some embodiments further includes another III-V semiconductor material layer 135 of the stack 110 of III-V compound semiconductor material layers that can be adjacent to the silicon layer 120. For instance, the other III-V semiconductor material layer 135 can be located between the first III-V semiconductor layer 112 and the doped portion 125 of the silicon waveguide layer 105. The other one III-V semiconductor material layer 135 can be doped with the same dopant type as the dopant type in the doped portion 125. This layer 135 can be a layer used primarily to facilitate the bonding between the III-V stack 110 and the silicon layer 120. For example, a thin layer of doped or undoped InP is often used. For example, in some cases, the other III-V semiconductor material layer 135, preferably has a thickness 137 of about 0.2 microns or less, and in some cases, more preferably about 0.1 microns or less.

The other III-V semiconductor material layer 135 can also be used to form part of the electrical junction. In some embodiments, the other one III-V semiconductor material layer is doped the same dopant type as the dopant type in the doped portion 125. For example, when the doped silicon portion 125 doped with p-type dopant then the other III-V semiconductor material layer 135 can also be doped with a p-type dopant. Such an arrangement can used for device 102 configurations having p-i-n junctions, for example. In some other embodiments, the other III-V semiconductor material layer 135 can be doped with the opposite dopant type as the dopant type in the doped portion 125. For example, when the doped silicon portion 125 doped with p-type dopant then the other III-V semiconductor material layer 135 can be doped with an n-type dopant. Such an arrangement can used for device 102 configurations having p-n-i-n junctions, for example.

In some embodiments of the modulator device 102, to facilitate efficient light transmission, the silicon optical waveguide layer 105 can be a upper silicon layer of a silicon-on-insulator substrate 107. For instance, in some cases, the waveguide layer 105 can be or include a mono-crystalline or polycrystalline layer of silicon formed on a silicon oxide layer 138 and silicon layer 139 of the silicon substrate 107.

In some embodiments, to provide sufficient electrical conductivity for the silicon layer 120, at least the portion 125 of the silicon optical waveguide layer 105 has a p-dopant (e.g., boron or other or other electron donor atom) concentration of at least about $1E17$ $cm^{-3}$, and in some cases, a concentration in a range of $1E17$ to $5E18$ $cm^{-3}$. In some embodiments, larger portions, or, the entire, silicon optical waveguide layer 105 can include the p-dopant, e.g., thus allowing fewer masking steps and thereby reduce the cost and time of device fabrication. However, in other embodiments, to reduce optical absorption losses other portions of the entire silicon optical waveguide layer 105, besides the p-doped silicon portion 125, or, and the landing pad portion (e.g., optional portion 158), are not doped. Analogous embodiments can exist in cases where the doped silicon portion 125 is doped with n-type dopant.

As further illustrated in FIG. 1, in some embodiments of the optical modulator device 102, edges 140, 142 of the first III-V semiconductor layer 112 and edges 144, 146 of the second III-V semiconductor layer 115 are vertically aligned with each other. Vertically aligned edges can result as a consequence of these two layers 112, 115 of the stack 110 being patterned simultaneously. Additionally, the first III-V semiconductor layer 112 provides mechanical support for the second III-V semiconductor layer 115. However, in other embodiments, one or both of edges 140, 142 of the first III-V semiconductor layer 112 and the edges 144, 146 of the second III-V semiconductor layer 115 are not vertically aligned. For instance in some cases, at least one edge 144 the second III-V semiconductor layer 115 can extend beyond the closest edge 140 of the first III-V semiconductor layer 112, e.g., to provide a landing pad location 148 for a first metallic electrical contact 150 of the device 102. In some cases, constructing the landing pad 148 of the second III-V layer 115 to be non-overlapping with the first III-V semiconductor layer 112 can reduce optical losses of light confined in the first III-V semiconductor layer 112 due to absorption of light by the metallic electrical contact 150.

As further illustrated in FIG. 1, embodiments of the optical modulator device 102 can further include a first metallic electrical contact 150 in contact with the second III-V semiconductor layer 115, and, a second metallic electrical contact 155 in contact with the silicon layer 120. In some embodiments, for instance, the metallic electrical contacts 150, 155 can be composed of aluminum, silver or gold and the electrode can be in direct contact with the p-doped or n-doped III-V compound semiconductor material layer of a second III-V semiconductor layer 115 or the n-doped or p-doped silicon portion 125 of a silicon layer 120, or, the n-doped or p-doped other III-V compound semiconductor material layer 135.

As also illustrated in FIG. 1, in some embodiments of the optical modulator device 102, the first metallic electrical contact 150 contacts a portion 148 of the second III-V semiconductor layer 115 (e.g., landing pad portion 148) that does not vertically overlap with the silicon layer 120, and, the second control metal electrode 155 contacts a portion of the silicon layer 120 (e.g., landing pad portion 158) that does not vertically overlap with the second III-V semiconductor layer 115. That is, the portion 148 of the second III-V semiconductor layer 115 that the first metallic electrical contact 150 contacts can be laterally offset from a part 160 of the second III-V semiconductor layer 115 that is adjacent (e.g., vertically adjacent in FIG. 1) to a central light containing portion of the first III-V semiconductor layer 112 (e.g., about the center of the example light modes 162 carried by the first III-V semiconductor layer 112). Similarly, the portion 158 of the silicon layer 120 that the second control metal electrode 155 contacts can be laterally offset from the part 164 of the silicon layer 120 that is adjacent (e.g., vertically adjacent in FIG. 1) to the major light containing portion of the first III-V semiconductor layer 112. In some cases, it is advantageous for one or both of the metallic electrical contacts 150, 155 to contact the offset portions 148, 158 of the second III-V semiconductor layer 115, silicon layer 120, respectively, in order to increase the distance between the light in the light retaining portion of the first III-V semiconductor layer 112 and light absorbing embodiments of the metallic electrical contacts 150, 155.

In other embodiments, however, to facilitate having a more laterally compact device 102, the metallic electrical contacts 150, 155 can be located directly (e.g., vertically) over the parts of the second III-V semiconductor layer 115, silicon layer 120 that are directly adjacent (e.g., vertically adjacent) to a light carrying portion of the first III-V semiconductor layer 112 (e.g., about the center of the example light modes 162).

As also illustrated in FIG. 1, in some embodiments of the optical modulator device 102, one or both of the contacting portions 148, 158 of the second III-V semiconductor layer 115, and silicon layer 120, respectively, that the first or second metallic electrical contacts 150, 155, contact contain higher concentrations (e.g., at least about 1.5 times, and in some cases, about 5 times, and in some cases, about 10 time higher concentrations) of the same dopant type as compared to the dopant concentration in one or both parts 160, 164 of the second III-V semiconductor layer 115, silicon layer 120 which are adjacent to the first III-V semiconductor layer 112. Some such embodiments, having such plus-doped portions 148, 158 can advantageously increase the electrical conductivity of the second III-V semiconductor layer 115 and silicon layer 120, while at the same time not having high concentrations of light-absorbing dopant in close proximity to the first III-V semiconductor layer 112. For instance, in some embodiments, when the silicon layer 120 includes a p-doped silicon portion 125, then the non-overlapping portion 158 may be composed of p+-doped silicon. Or, when the silicon layer 120 includes an n-doped silicon portion 125, then the non-overlapping portion 158 can be composed of n+-doped silicon.

Figure 2:
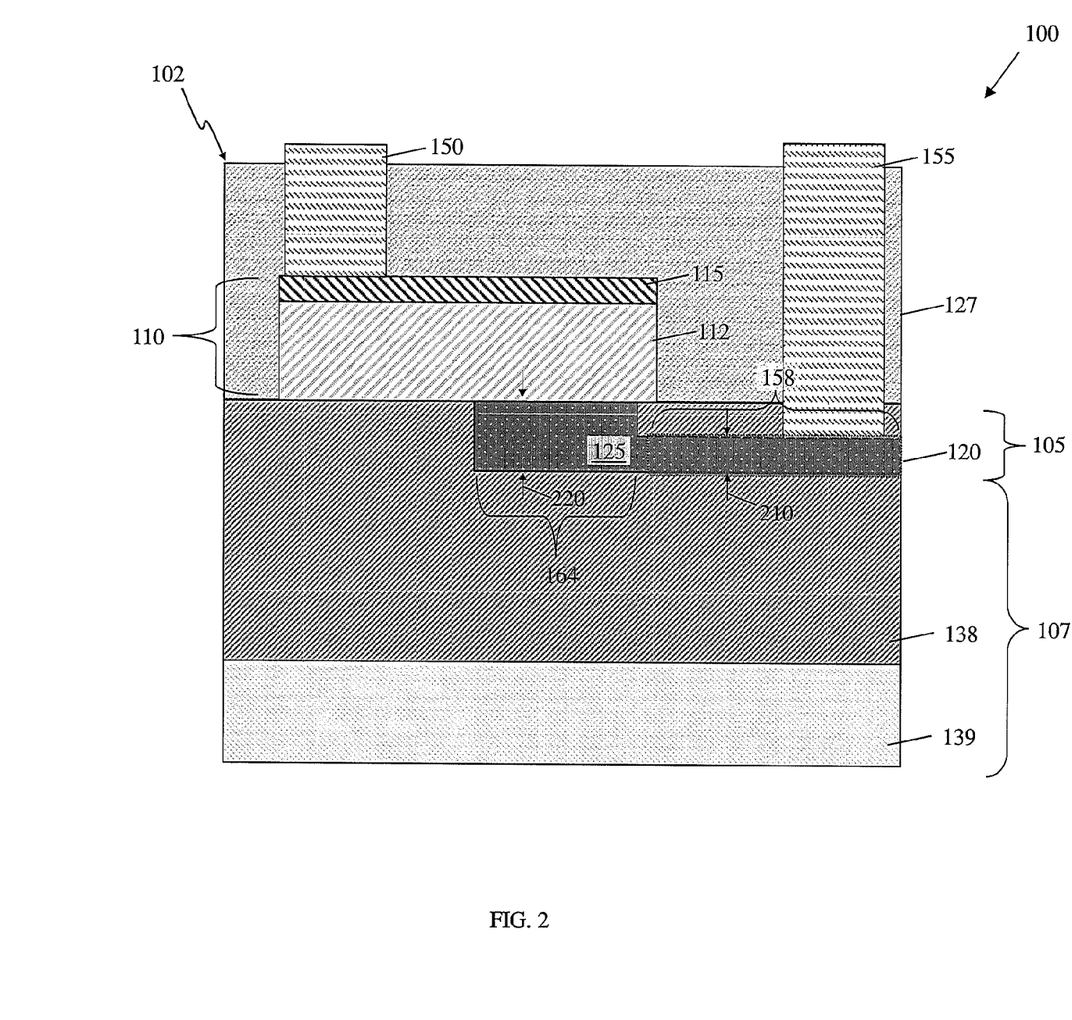
FIG. 2 presents a cross-sectional view of another embodiment of an optical device that comprises an alternative optical modulator.

FIG. 2 presents a cross-sectional view of an embodiment of an optical device 100 that comprises an alternate embodiment of the optical modulator device 102 of the disclosure. For the optical modulator device 102 depicted in FIG. 2, the portion 158 of the silicon layer 120 that the second control metal electrode 155 contacts, has a smaller thickness 210 as compared to a thickness 220 of a part 164 of the silicon layer 120 that is adjacent (e.g., vertically adjacent) to the first III-V semiconductor layer 112. For instance, in some cases, the portion's 158 thickness is about 10 percent or less, and in some cases about 50 percent or less of the thickness 220 of the part 164 adjacent to the first III-V semiconductor layer 112. For the Some such embodiments, can advantageously facilitates increased lateral confinement of light to within portions the light modes 162 within the part 164 of the silicon layer 120 that is adjacent to the first III-V semiconductor layer 112, and, to reduce light mode overlap with the plus-doped portion 158 (e.g., a p+ doped portion) and thereby reduce light absorption.

Figure 3:
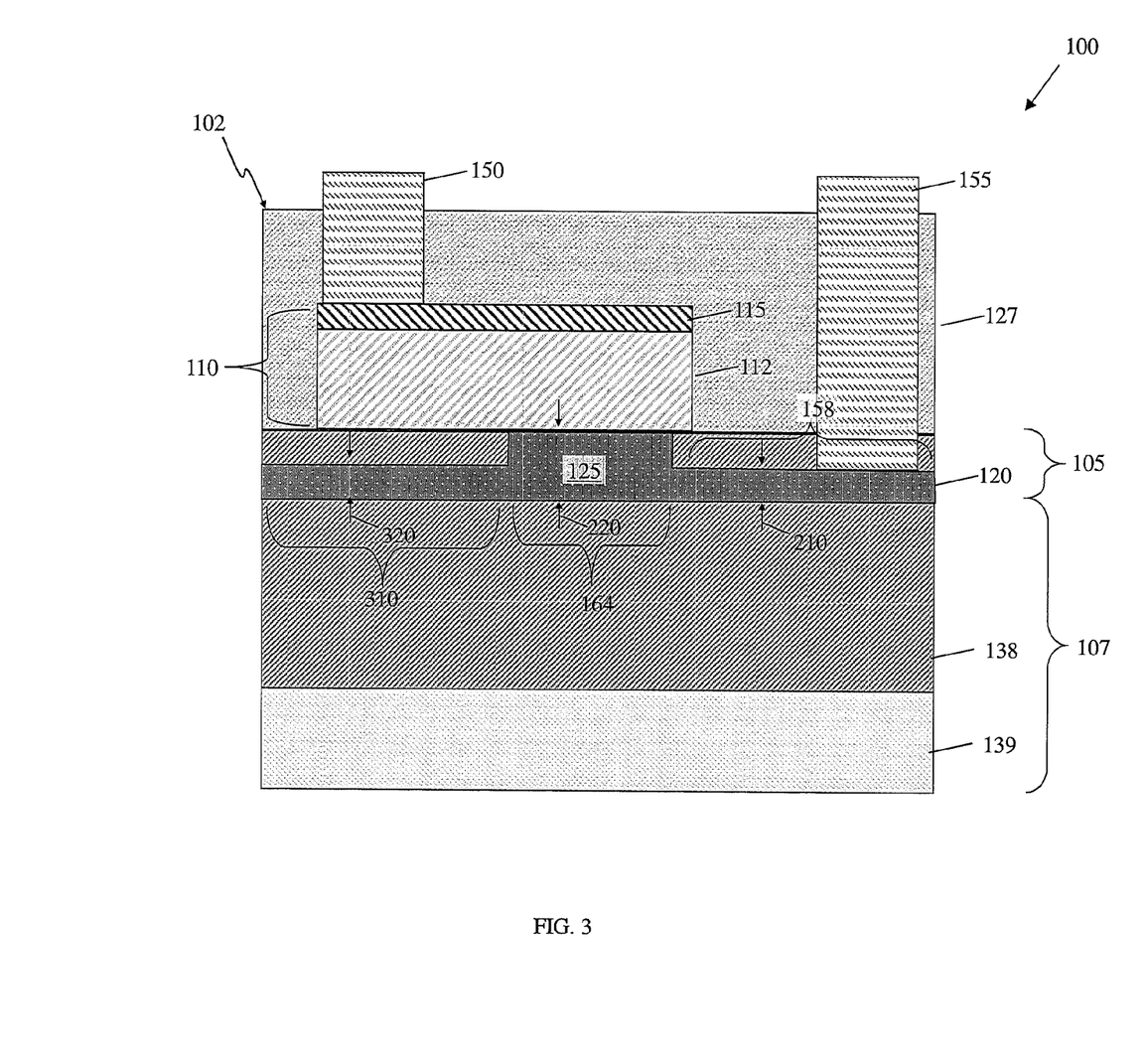
FIG. 3 presents a cross-sectional view of another embodiment of an optical device that comprises an alternative optical modulator.

FIG. 3 presents a cross-sectional view of another embodiment of an optical device 100 that comprises an alternative embodiment of the optical modulator device 102 of the disclosure. The optical modulator device 102 depicted in FIG. 3, differs from the device 102 shown in FIG. 2 in that there is an additional portion 310 the silicon layer 120 that has a thickness 320 that is smaller than the thickness 220 of the part 164 of the silicon layer 120 that is adjacent to the first III-V semiconductor layer 112. As further illustrated, in some cases the additional portion 310 does not serve as a contact 158 for the second metal electrode 155. For instance, in some embodiments, the fabrication of the silicon layer 120 shown in FIG. 3 includes only a single partial etch to reduce the thicknesses 210, 310 of the second electrode's 155 landing pad portion 158 and additional portion 310. In some cases, the fabrication of the silicon layer 120, shown in FIG. 2, can include a partial etch step to reduce the thickness 210 of the landing pad portion 158, and, a second etch to remove the entire additional portion 310.

As illustrated in FIG. 1, in some embodiments, the silicon layer 120 is in electrical contact with the first III-V semiconductor layer 112. In such cases, the optical modulator device 102 can be configured as an electro-optic absorption modulator and/or an electro-optic phase modulator. One skilled in the art would understand that phase modulation can be used to produce other modulation formats. For example, the phase modulation in one arm of an interferometer, e.g., a Mache-Zehnder device (MZD), can be converted to an intensity modulation.

As well understood by those skilled in the art, for the former such configuration, an applied voltage between the first and second metallic electrical contacts 150, 155 changes the band gap in the first III-V semiconductor layer 112, which in turn, shifts the optical absorption edge. When light is absorbed, a current is produced, and that current can pass, via a conductive pathway, through the first III-V semiconductor layer 112 to the second III-V semiconductor layer 115 and silicon layer 120 and the first and second metallic electrical contacts 150, 155.

As also well understood by those skilled in the art, for the latter such configuration, an applied voltage between the first and second metallic electrical contacts 150, 155 can produce an electrical field in the first III-V semiconductor layer 112 which changes the RI of first III-V semiconductor layer 112, which in turn, changes the phase of light in the first III-V semiconductor layer 112, without substantially change in the absorption of light in the first III-V semiconductor layer 112. Consequently, in some such embodiments of the device 102, a conductive pathway for the photo-generated current is not required. One example of such an embodiment is when the other III-V semiconductor material layer 135 in FIG. 1 is doped with an opposite dopant type as that of the doped portion 125, forming for example, the device 102 with p-n-i-n junction.

Figure 4:
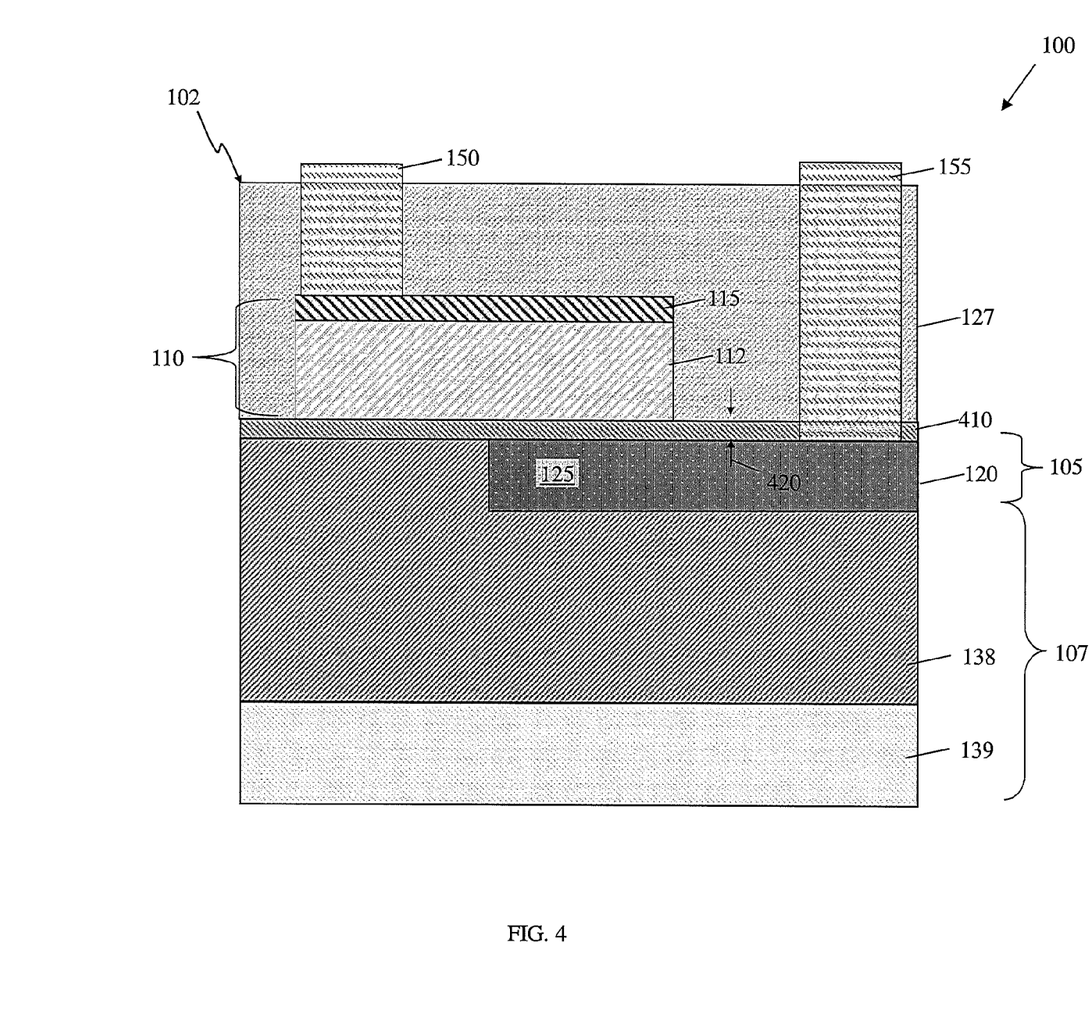
FIG. 4 presents a cross-sectional view of another embodiment of an optical device of the disclosure that comprises another alternative embodiment of the optical modulator of the disclosure.

Another example of such an embodiment is illustrated in FIG. 4, which presents a cross-sectional view of an optical device 100 that comprises such an embodiment of the optical modulator device 102. As illustrated, the device 102 further includes an insulating layer 410 between the first III-V semiconductor layer 112 and the silicon layer 120 (e.g., the doped silicon portion 125 and/or optional other III-V layer 135 shown in FIG. 1). For instance, in some cases, the insulating layer 410 can be composed of silicon oxide, silicon nitride or similar dielectric material, e.g., deposited using processes well known to those skilled in the art.

In some embodiments of the device 102 such as shown in FIG. 4, the presence of insulating layer 410 facilitates combining the substrate 107 and the silicon waveguide layer 105 thereon with a second substrate (e.g., a III-V compound semiconductor substrate) that includes, or is, the stack 110 of III-V compound semiconductor layers. One skilled in the art would be familiar with wafer bonding procedures to accomplishing such combining.

In some embodiments of the device 102, such as shown in FIG. 4, it is desirable to keep the insulating layer 410 thin, so that a sufficient strong electrical filed can be produced in the first III-V semiconductor layer 112, when a voltage is applied between the first and second metallic electrical contacts 150, 155. For instance, in some embodiments, the insulating layer 410 has a thickness 420 of about 0.2 microns or less, and in some cases, about 0.1 microns or less, and in some cases, about 0.05 microns of less.

Figure 5:
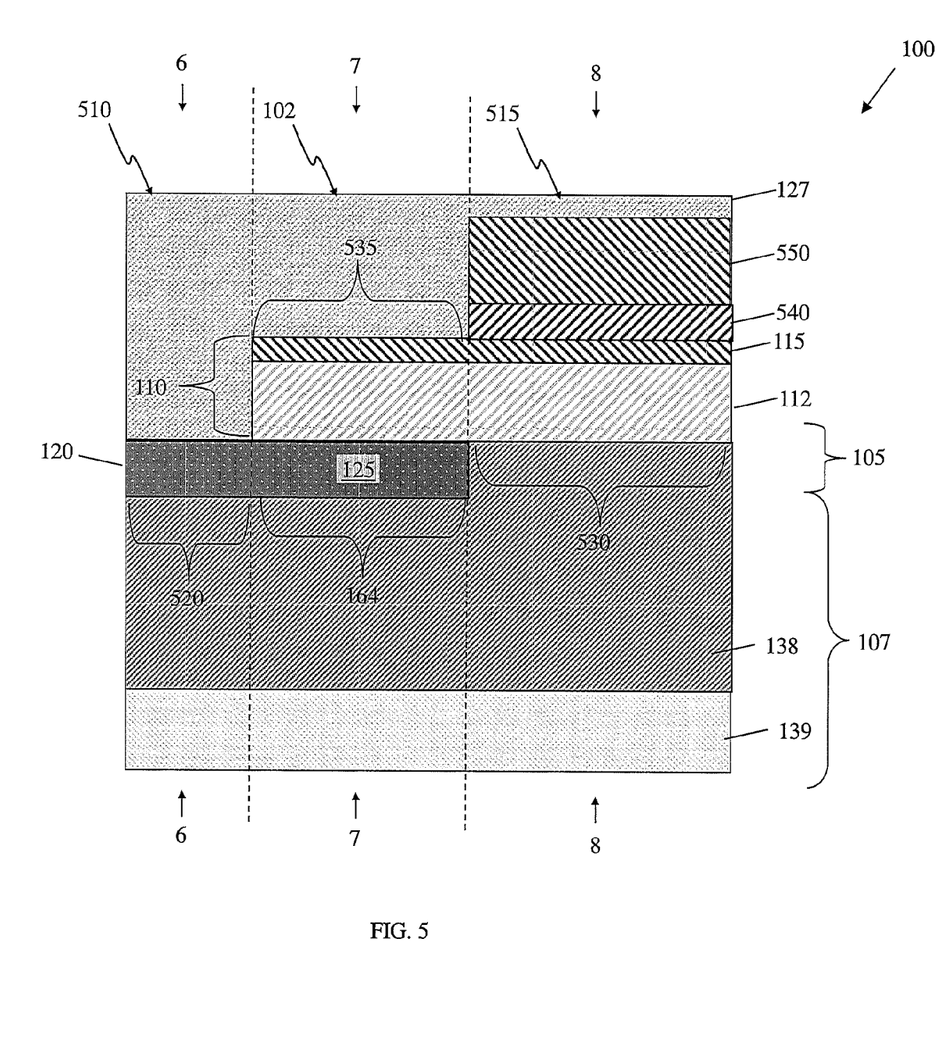
FIG. 5 presents a schematic cross-section view of an embodiment of an optical device that comprises an example optical modulator which is integrated with a passive optical device and another active optical device.

FIG. 5 presents a schematic cross-section view of an example embodiment of an optical device 100 of the disclosure that comprises an example optical modulator device 102 of the disclosure configured as a component of the device 100 which is integrated with one or both of a passive optical device component 510 and another active optical device component 515 of the optical device 100 (e.g., an active device in addition to the active optical modulator device 102).

In some cases, for example, the optical device 100 is a photonic integrated circuit device, and, the optical modulator device 102 is one of a plurality of passive or active device components 102, 510, 515 in the photonic integrated circuit device. As understood by those skilled in the art, such devices 100 can include electronic components used in conventional integrated electronic circuits, e.g. active electronic devices, such as transistors, passive electronic elements such as contacts, vias, and interconnects, for example, as disclosed in U.S. patent application Ser. No. 13/326,583 (583') filed in Dec. 15, 2011 which is incorporated by reference herein in its entirety. As further disclosed in the 583' application, some these electronic components can be integrated with, and control, various passive and active optical device components of the device 100, including optical modulator devices.

Figure 6:
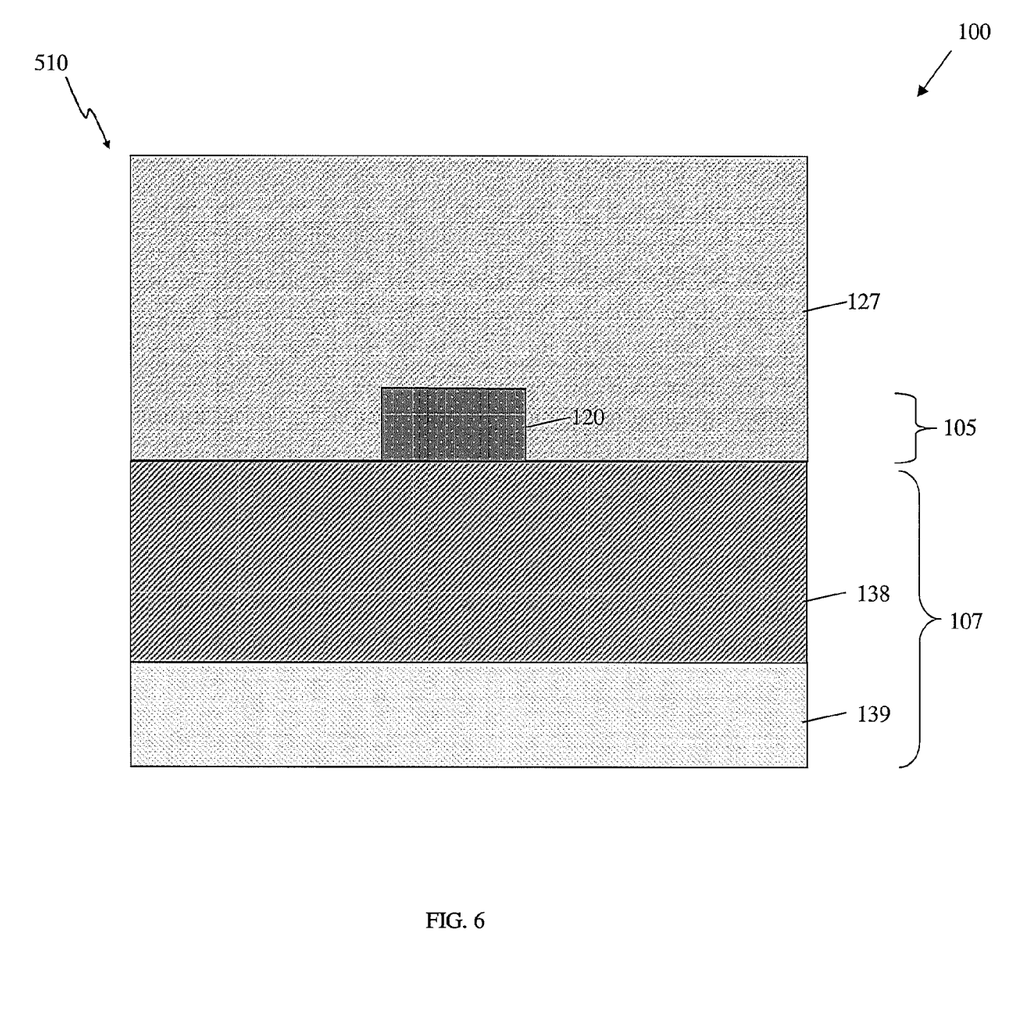
FIG. 6 presents a cross-sectional view, along view line 6-6, of the passive optical device in FIG. 5.

As illustrated in FIG. 5, in some embodiments, the optical modulator device 102 is an active device component of the optical device 100 (e.g., configured as a photonic integrated circuit device), and, another part 520 of the silicon waveguide layer 105 is part of a passive optical device component 510 of the device 100. For instance, FIG. 6 presents a cross-sectional view, along view line 6-6 in FIG. 5, of the example passive optical device component 510. As illustrated in FIG. 5, in some cases, the other part 520 of the silicon waveguide layer 105 can be continuously connected to the doped silicon portion 125 of the silicon waveguide layer 105. In some cases, for instance, the optical modulator device 102 can transfer optical modulated signals to the other part 520 of the silicon waveguide layer 105. The other part 520 of the silicon waveguide layer can be surrounded by a suitable cladding material layer 127 (e.g., an insulating layer 127 of silicon oxide in some cases). Non-limiting examples of embodiments of the passive optical device component 510 include passive interconnecting waveguides, passive optical splitters, passive optical combiners, passive optical filters or passive optical multiplexer-demultiplexers of the optical device 100.

Figure 7:
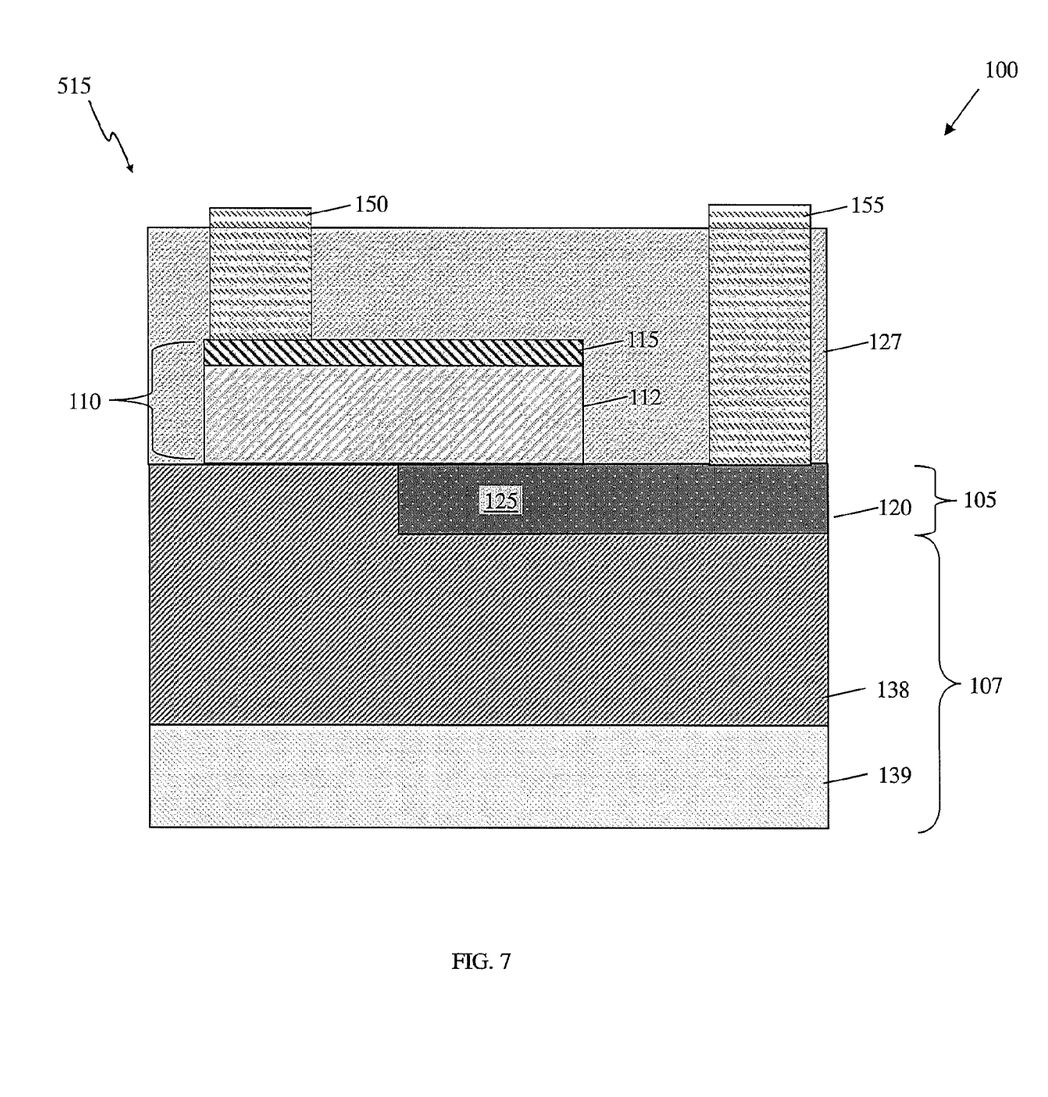
FIG. 7 presents a cross-sectional view, along view line 7-7, of the example optical modulator in FIG. 6.
Figure 8:
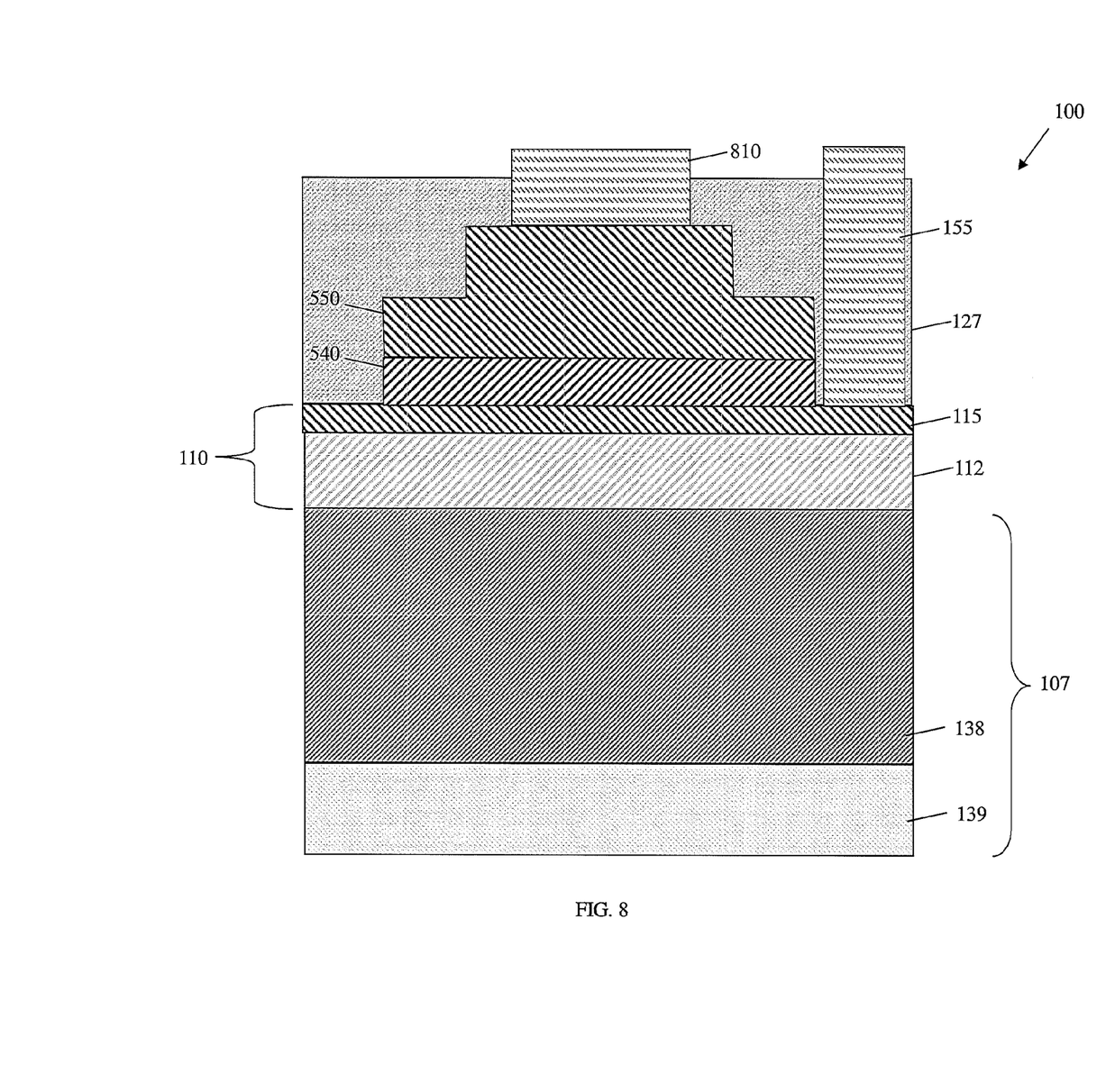
FIG. 8 presents a cross-sectional view, along view line 8-8, of the other active optical device in FIG. 6.

As also illustrated in FIG. 5, in some embodiments, the optical modulator device 102 is an active device component of the optical device 100 (e.g., configured as a photonic integrated circuit device), and, another portion 530 of the stack 110 is part of another active optical device component 515 of the optical device 100. For instance, FIG. 7 presents a cross-sectional view, along view line 7-7 of FIG. 5, of the example optical modulator device component 102, and, FIG. 8 presents a cross-sectional view, along view line 8-8 of FIG. 5, of the other example active optical device component 515 in FIG. 6. As illustrated in FIG. 5, in some cases, the other portion 530 of the stack 110 that is part of the other active optical device component 515 can be continuously connected to a portion 535 of the stack 110 that is part of the optical modulator device 102, e.g., to facilitate transmission of the light between these two active components 102, 515. For instance, as illustrated in FIG. 5, in some cases, for one or both of first III-V semiconductor layer 112 and second III-V semiconductor layer 115, the other portion 530, are part of the other active optical device component 515. Non-limiting examples of embodiments of the other active optical device component 515 include optical lasers, an optical amplifiers or optical detectors.

For instance, as illustrated in FIGS. 5 and 8, in some cases to facilitate providing some such embodiments, the other active device component 515 can includes a III-V compound semiconductor absorber layer 540, or, in the alterative III-V compound semiconductor gain layer 540, located in-between the second III-V semiconductor layer 115 and a third III-V semiconductor layer 550, e.g., contacted by for a third metal electrode 810. The third layer 550 is doped with an opposite dopant type than the dopant type of the second III-V semiconductor layer 115. For instance, when the second III-V semiconductor layer 115 is doped with an n-type dopant, then the third layer 550 can be doped with a p-type dopant. The first and third layers 115, 540 thereby provide a p-n junction of the other active optical device 515.

One skilled in the art would understand how to configure the first III-V semiconductor layer 112 and the other III-V compound semiconductor layer 540 to facilitate providing various different embodiments of the other active device component 515. For instance, for the other active device component 515 configured as an optical laser, the first III-V semiconductor layer 112 in the other portion 530 of the stack can be formed into a reflective cavity and current injection, through the first and third layers 115, 550 can be performed to generate an optical signal. For instance, for the other active device component 515 configured as an optical amplifier, the other III-V compound semiconductor layer 540 can be configured as a gain layer, and, current injection into the first III-V semiconductor layer 112 in the other portion 530 can be performed, where the first III-V semiconductor layer 112 in the other portion 530 is not configured as a reflective cavity. For instance, for the other active device component 515 configured as an optical detector, the other III-V compound semiconductor layer 540 can be configured as an absorber layer, and, there is a reverse bias voltage applied across the first III-V semiconductor layer 112, e.g., in the other portion 530. One of ordinary skill would understand how to adjust the composition of the other III-V compound semiconductor layer 540 to provide a gain layer or absorber layer as needed. For instance, in some cases, the proportions of Ga to In to As to P, in layer 540, can be adjusted to shift the optical absorption band edge to the desired value to absorb light or pass light (e.g., about 1500-1550 nanometers in same cases) at a light transmission wavelength in the first III-V semiconductor layer 112.

As also illustrated in FIG. 8 in some embodiments, it is preferable for the silicon waveguide layer 105 to not be present in the portion 530 of the first III-V semiconductor layer 112 that is part of other active device component 515 to facilitate increased optical confinement in the gain or absorber layer 540, e.g., by shifting the optical mode in first III-V semiconductor layer 112 towards the layer 540.

Another embodiment is an apparatus, e.g., including any of the optical devices or apparatuses described herein. With continuing reference to FIGS. 1-8, the apparatus comprises an optical modulator 102, wherein the optical modulator 102 comprises a planar substrate 107, a first III-V semiconductor layer 112 on the substrate 107, and a silicon layer 120 on the substrate 107. The optical modulator 102 includes a planar semiconductor optical waveguide 105 having a hybrid optical core, the hybrid optical core including vertically adjacent lateral portions (e.g., parts 160, 164) of the first III-V semiconductor layer 112 and the silicon layer 120.

In some such embodiments, a lower portion (e.g., lower port of parts 160) of the first III-V semiconductor layer 112 is in physical contact with an upper portion (e.g., upper portion of part 164) of the silicon layer 120.

Any such embodiments can further comprise a first metallic electrical contact 150 in physical contact with the first III-V semiconductor layer 112; and a second metallic electrical contact 155 in physical contact with the silicon layer 120. In some such embodiments, the first and second metallic contacts 150, 155 are able to apply a voltage across the hybrid optical core such that an optical refractive index of the hybrid optical core is changed. In other such embodiments, the first and second metallic electrical contacts 150, 155 are able to apply a voltage across the hybrid optical core such that an optical attenuation of the hybrid optical core is changed.

Any such embodiments can further include a second III-V semiconductor layer 115 adjacent to the first III-V semiconductor layer 112, wherein the hybrid optical core includes vertically adjacent lateral portions of the first and second III-V semiconductor layers, 112, 115 and the silicon layer 120 (vertical adjacent to parts 160, 164). In some such embodiments, a first metallic electrical contact 150 is in physical contact with the second III-V semiconductor layer 115 and a second metallic electrical contact 155 in physical contact with the silicon layer 120.

In any such embodiments, the first and second III-V semiconductor layers 112, 115 can be part of a stack 110 of III-V semiconductor layers, each layer 112, 115 of the stack 110 having a different III-V semiconductor alloy composition.

Any such embodiments can further include an insulating layer 410 located adjacent to the first III-V semiconductor layer 112 and the silicon layer 120.

Figure 9:
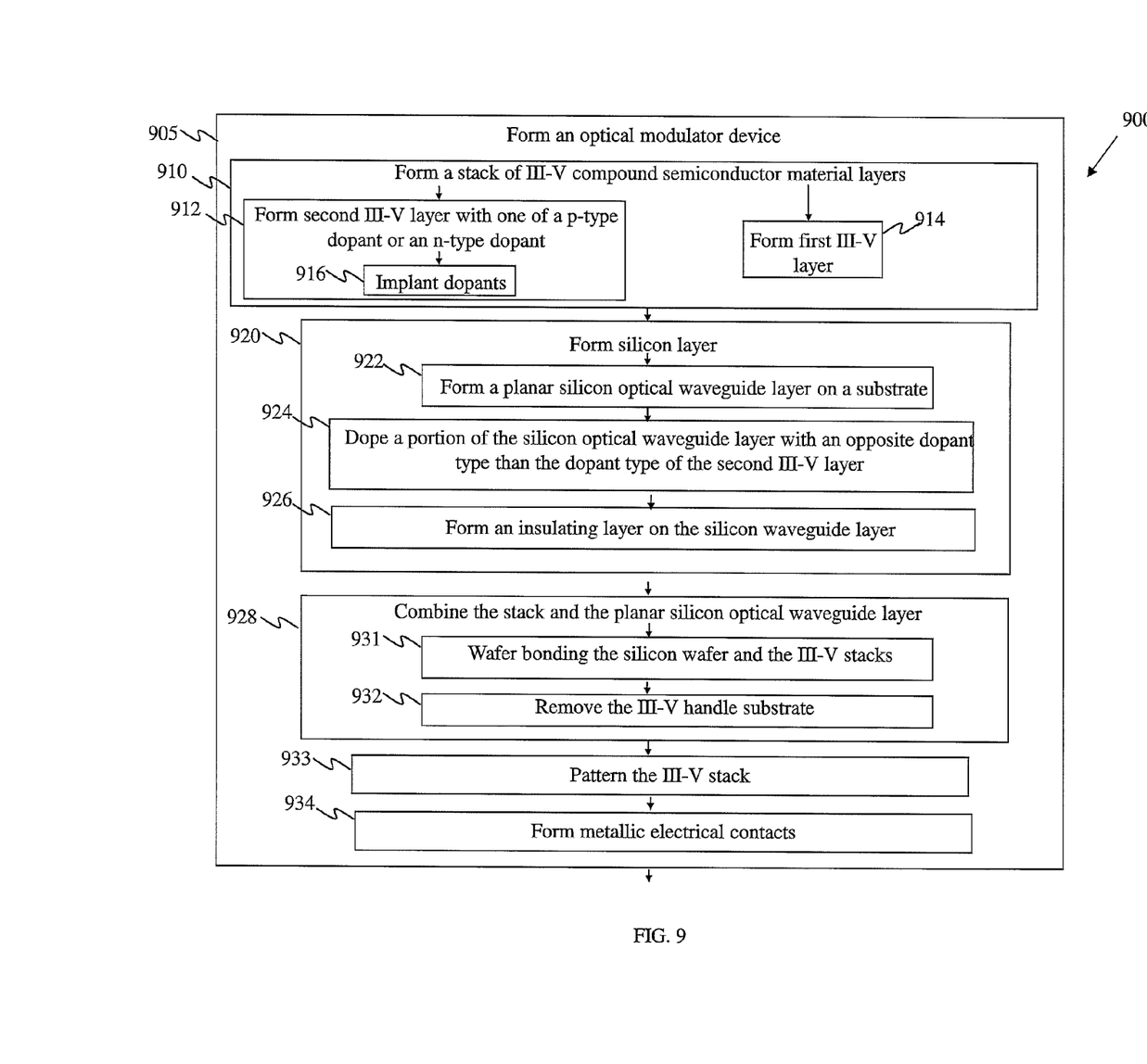
FIG. 9 presents a flow diagram illustrating a method of manufacture of an optical device including any of the optical devices depicted and discussed in the context of FIGS. 1-8.

Another embodiment of the disclosure is a method of manufacturing an optical device or apparatus. FIG. 9 presents a flow diagram illustrating selected steps of an example method 900 of manufacturing of the optical device or apparatus of the disclosure, including any of the optical devices or apparatuses 100 depicted and discussed in the context of FIGS. 1-8.

With continuing reference to FIGS. 1-8 throughout, the method 900 comprises a step 905 of forming an optical modulator device 102 of the optical device or apparatus 100. Forming the optical modulator device 102 (step 905) includes a step 910 of forming a stack 110 of III-V compound semiconductor material layers. Forming the stack 110 (step 910) includes forming, in step 912, forming a second III-V semiconductor layer 115 doped with one of a p-type dopant or an n-type dopant, forming, in step 914 a first III-V semiconductor layer 112 having at least one electro-optic material layer (and as discussed in the context of FIG. 1, in some cases, one or more quantum well layers interleaved with barrier layers) adjacent to the second III-V semiconductor layer 115. One skilled in the art would be familiar with various processes to grow III-V compound semiconductor material layers of the stack 110, via: physical vapor deposition (PVD), chemical vapor deposition (CVD), or molecular beam epitaxy (MBE). In some cases, as part the step 912 to form the second III-V semiconductor layer 115 in-situ doping is performed during growth of the layer 115 (e.g., by adding dopant during an epitaxial growth process). In other cases, the step 912 to form the second III-V semiconductor layer 115 includes a step 916 to implant the layer 115 with n- or p-type dopants via ion implantation processes familiar to those skilled in the art.

Forming the optical modulator device 102 (step 905) also includes a step 920 of forming a silicon layer 120. Forming the silicon layer 120 (step 920) includes a step 922 of forming a planar silicon optical waveguide layer 105 on a substrate 107. As discussed above in the context of FIG. 5, parts of the waveguide layer 105 can be used for other purposes than forming the silicon layer 120. Forming a silicon layer 120 (step 920) also includes a step 924 of doping a portion 125 of the silicon optical waveguide layer 105 with the opposite one of the p-type dopant or the n-type dopant as present in the second III-V semiconductor layer 115. One of ordinary skill would be familiar with how to form silicon waveguide layers, e.g., using processes to etch and dope such layers.

In some cases, forming the silicon layer 120 in step 920 can include an optional step 926 of forming an insulating layer 410, e.g., of silicon oxide or silicon nitride, on the silicon waveguide layer 105. The insulating layer 410 can facilitate combining the planar silicon optical waveguide layer 105 and the stack of III-V compound semiconductor material layers 110.

Forming the optical modulator device 102 (step 905) also includes a step 930 of combining the stack of III-V compound semiconductor material layers 110 and the planar silicon optical waveguide layer 105 such that the first III-V semiconductor layer 112 is located in-between the second III-V semiconductor layer 115 and the silicon layer 120 that includes the doped portion 125 of the silicon optical waveguide layer 105. One skilled in the art would be familiar with various procedures to such as layer planarization can be used to prepare the wafer prior to the bonding.

For instance, in some cases, the combining step 930 includes a wafer bonding step 931. One of ordinary skill would be familiar with wafer bonding techniques to combine the stack 110 and the planar silicon optical waveguide layer 105. For instance, in some cases as part of the wafer bonding step 931 the stack of III-V compound semiconductor material layers 110 can be attached to a substrate (e.g., a handle substrate) which can be removed in step 932, after the wafer bonding process (step 931). In some cases, layers of the III-V stack 110 can be formed (e.g., as part of step 910) on the handle substrate which is subsequently removed (step 932).

Embodiments of the method 900 can include various additional steps to facilitate forming embodiments of the optical modulator device component 102. For instance, embodiments of the method 900 can further include a step 933 of patterning the stack of III-V compound semiconductor material layers 110. For instance, the stack of layers 110 can be patterned after the wafer bonding process 932 and after removal of the optional handle substrate. Embodiments of the method 900 can further include a step 934 of forming metallic electrical contacts 150, 155 on the second III-V semiconductor layer 115 and silicon layer 120. One of ordinary skill would be familiar with such metallization processes commonly used in micro-fabrications. Some embodiments of the method 900 can further include doping a landing pad portion 158 of the silicon layer 120 (e.g., as part of step 924) prior to the step 934 of forming the metal control electrode 155.

Various embodiments of the method 900 can further include additional steps to form other components of the optical device 500. For instance, some embodiments of the method 900 of manufacture further include a step 935 of forming a passive optical device component 510 of the device 100. For instance, in some embodiments, forming the passive optical device component 510 (step 935) can include patterning in step 937 another part 520 of the silicon waveguide layer 105 that is not part of the optical modulator device component 102, e.g., not part of the doped silicon portion 125 of the silicon layer 120.

For instance, some embodiments of the method 900 of manufacture further include a step 940 of forming another active optical device component 515 of the device 100. In some embodiments, as part of forming the active optical device component 515 (step 940), the method 900 can include a step 945 of forming an absorber or gain layer 540 on a portion 530 of the stack 110 (e.g., on the first metallic electrical contact 150) that is not part of the optical modulator device component 102. Forming the active optical device component 515 (step 940) can also include a step 950 of forming a third layer on the absorber or gain layer 540 with an opposite dopant type than the dopant type of the dopant type of the second III-V semiconductor layer 115.

Figure 10:
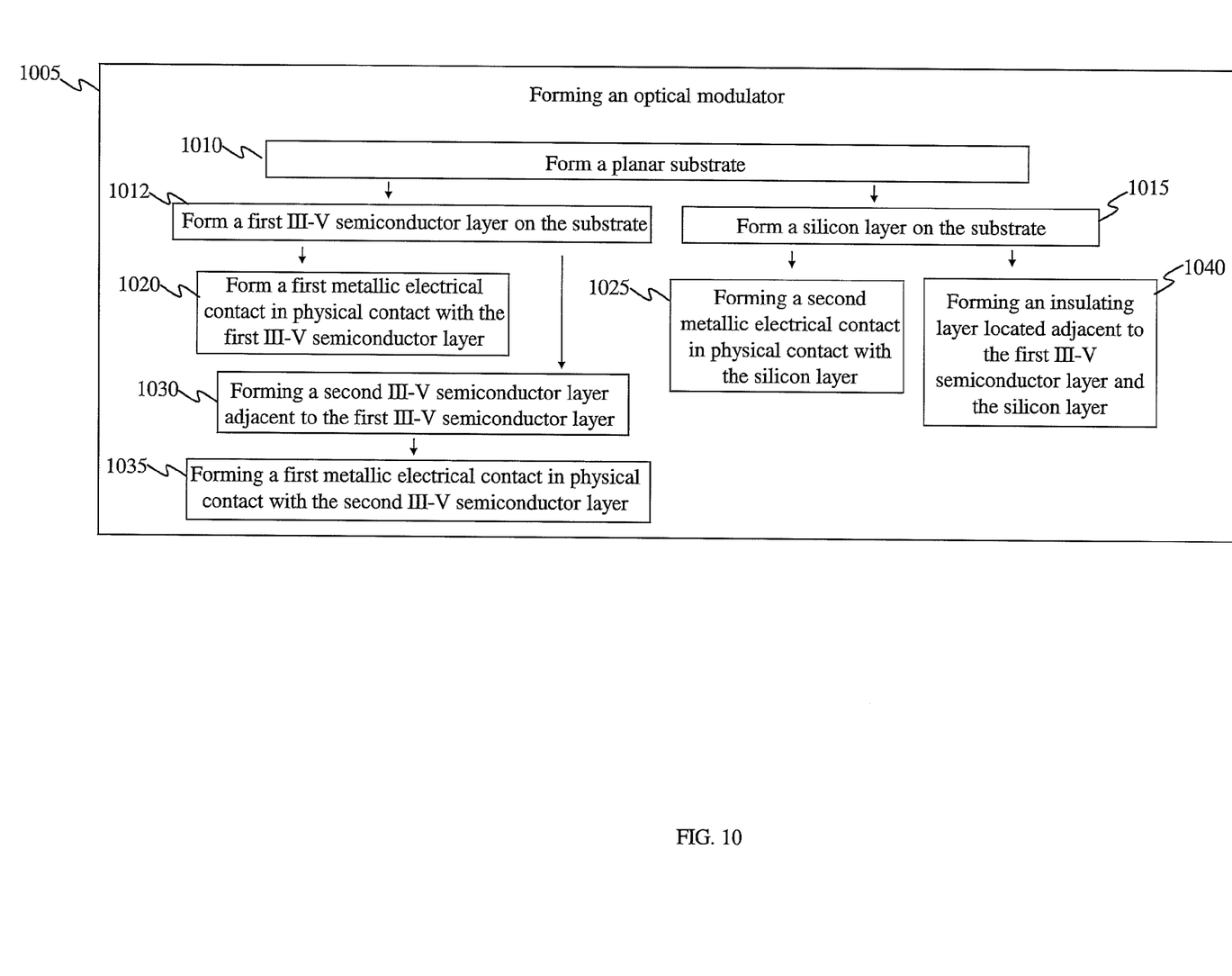
FIG. 10 presents a flow diagram illustrating a method of the disclosure.

Another embodiment is a method. Referring to FIG. 10 and with continuing reference to FIGS. 1-8, the method comprises forming an optical modulator 102 (step 1005), including: forming a planar substrate 107 (step 1010), forming a first III-V semiconductor layer 112 on the substrate 107 (step 1012), and forming a silicon layer 120 on the substrate 107 (step 1015). The optical modulator 102 includes a planar semiconductor optical waveguide 105 having a hybrid optical core, the hybrid optical core including vertically adjacent lateral portions (e.g., parts 160, 164) of the first III-V semiconductor layer 112 and the silicon layer 120.

In some such embodiments, a lower portion (e.g., lower port of parts 160) of the first III-V semiconductor layer 112 is in physical contact with an upper portion (e.g., upper portion of part 164) of the silicon layer 120.

Any such embodiments can further comprise forming a first metallic electrical contact 150 in physical contact with the first III-V semiconductor layer 112 (step 1020) and forming a second metallic electrical contact 155 in physical contact with the silicon layer 120 (step 1025). In some such embodiments, the first and second metallic contacts 150, 155 are able to apply a voltage across the hybrid optical core such that an optical refractive index of the hybrid optical core is changed. In other such embodiments, the first and second metallic electrical contacts 150, 155 are able to apply a voltage across the hybrid optical core such that an optical attenuation of the hybrid optical core is changed.

Any such embodiments can further include forming a second III-V semiconductor layer 115 adjacent to the first III-V semiconductor layer (step 1030), wherein the hybrid optical core includes vertically adjacent lateral portions of the first and second III-V semiconductor layers, 112, 115 and the silicon layer 120 (e.g., vertically adjacent to parts 160, 164). Some such embodiments can include forming a first metallic electrical contact 150 (step 1035) in physical contact with the second III-V semiconductor layer, and forming a second metallic electrical contact in physical contact with the silicon layer (step 1025). In any such embodiments, the first semiconductor layer 112 (step 1010) and the second III-V semiconductor layer 115 (step 1030) can be part of a stack 110 of III-V semiconductor layers 112, 115, each layer 112, 115 of the stack 110 having a different III-V semiconductor alloy composition.

Any such embodiments can further include forming an insulating layer 410 (step 1040) located adjacent to the first III-V semiconductor layer 112 and the silicon layer 120.

Although the present invention has been described in detail, those skilled in the art should understand that they can make various changes, substitutions and alterations herein without departing from the scope of the invention.

What is claimed is:

1. An apparatus, comprising:
   an optical modulator, wherein the optical modulator comprises:
   a planar substrate;
   a III-V semiconductor layer on the substrate;
   a silicon layer on the substrate;
   a first metallic electrical contact in physical contact with the III-V semiconductor layer;
   a second metallic electrical contact in physical contact with the silicon layer; and wherein the optical modulator includes a planar semiconductor optical waveguide having a hybrid optical core, the hybrid optical core including vertically overlapping and adjacent lateral portions of the first III-V semiconductor layer and the silicon layer; and wherein the first and second metallic electrical contacts are laterally offset from the vertically overlapping portions of the layers.

2. The apparatus of claim 1, wherein a lower portion of the III-V semiconductor layer is in physical contact with an upper portion of the silicon layer.

3. The apparatus of claim 1,
wherein the first and second metallic contacts are able to apply a voltage across the hybrid optical core such that an optical refractive index of the hybrid optical core is changed.

4. The apparatus of claim 1,
wherein the first and second metallic electrical contacts are able to apply a voltage across the hybrid optical core such that an optical attenuation of the hybrid optical core is changed.

5. The apparatus of claim 1, further including a second III-V semiconductor layer adjacent to the III-V semiconductor layer, wherein the hybrid optical core includes vertically adjacent lateral portions of the first III-V semiconductor layer and the second III-V semiconductor layer, and the silicon layer.

6. The apparatus of claim 1, wherein the III-V semiconductor layer is part of a stack of III-V semiconductor layers, each layer of the stack having a different III-V semiconductor alloy composition.

7. The apparatus of claim 1, further including an insulating layer located adjacent to the III-V semiconductor layer and the silicon layer.

8. A method, comprising:
forming an optical modulator, including:
forming a planar substrate;
forming a III-V semiconductor layer on the substrate;
forming a silicon layer on the substrate;
forming a first metallic electrical contact in physical contact with the III-V semiconductor layer; and
forming a second metallic electrical contact in physical contact with the silicon layer; and
wherein the optical modulator includes a planar semiconductor optical waveguide having a hybrid optical core, the hybrid optical core including vertically overlapping and lateral portions of the first III-V semiconductor layer and the silicon layer;
wherein the first and second metallic electrical contacts are laterally offset from the vertically overlapping portions of the layers.

9. The method of claim 8, wherein a lower portion of the III-V semiconductor layer is in physical contact with an upper portion of the silicon layer.

10. The method of claim 8,
wherein the first and second metallic contacts are able to apply a voltage across the hybrid optical core such that an optical refractive index of the hybrid optical core is changed.

11. The method of claim 8,
wherein the first and second metallic electrical contacts are able to apply a voltage across the hybrid optical core such that an optical attenuation of the hybrid optical core is changed.

12. The method of claim 8, further including:
forming a second III-V semiconductor layer adjacent to the first III-V semiconductor layer, wherein the hybrid optical core includes vertically adjacent lateral portions of the first III-V semiconductor layer and second III-V semiconductor layers, and the silicon layer.

13. The method of claim 8 , wherein
the semiconductor layer is part of a stack of III-V semiconductor layers, each layer of the stack having a different III-V semiconductor alloy composition.

14. The method of claim 8, further including:
forming an insulating layer located adjacent to the III-V semiconductor layer and the silicon layer.

\* \* \* \* \*